United States Patent

Hayden, Sr. et al.

[11] Patent Number: 5,872,701
[45] Date of Patent: Feb. 16, 1999

[54] BLIND ALIGNMENT METHOD AND APPARATUS FOR CIRCUIT BOARDS

[75] Inventors: Perry L. Hayden, Sr., San Jose; Randall J. Diaz, Gilroy, both of Calif.

[73] Assignee: Tandem Computers, Incorporated, Cupertino, Calif.

[21] Appl. No.: 807,608

[22] Filed: Feb. 27, 1997

[51] Int. Cl.⁶ .............................. H01R 23/68; H01R 23/70
[52] U.S. Cl. ..................... 361/786; 361/741; 361/756; 361/802; 439/377
[58] Field of Search ................................ 361/784, 741, 361/785, 756, 786, 788, 791, 803, 804, 802; 439/51, 52, 59, 61, 62, 64, 65, 377, 483, 157, 629, 630, 633, 680, 951

[56] References Cited

U.S. PATENT DOCUMENTS

| | | | |
|---|---|---|---|
| 2,832,013 | 4/1958 | Pedersen et al. | 439/64 |
| 3,116,959 | 1/1964 | Abodeely . | |
| 3,129,044 | 4/1964 | Lyman, Jr. et al. . | |
| 3,264,601 | 8/1966 | Hartholz . | |
| 3,533,045 | 10/1970 | Henschen | 361/786 |
| 3,571,780 | 3/1971 | Boenning et al. . | |
| 3,951,500 | 4/1976 | Anderson . | |
| 4,361,372 | 11/1982 | Majkrzak et al. . | |
| 4,509,258 | 4/1985 | Locati et al. | 29/876 |
| 4,546,414 | 10/1985 | Donges | 361/786 |
| 4,579,406 | 4/1986 | Laursen et al. | 361/786 |
| 4,682,833 | 7/1987 | Ferchau et al. | 439/377 |
| 4,853,830 | 8/1989 | Corfits et al. . | |
| 4,963,098 | 10/1990 | Myer et al. | 439/76 |
| 5,040,997 | 8/1991 | Garner | 439/633 |
| 5,045,960 | 9/1991 | Eding | 360/97.01 |
| 5,077,722 | 12/1991 | Geist et al. | 439/157 |
| 5,385,481 | 1/1995 | Kotyuk | 439/378 |
| 5,387,132 | 2/1995 | Sarver et al. | 439/633 |
| 5,458,497 | 10/1995 | Yasumura et al. | 439/62 |

FOREIGN PATENT DOCUMENTS

| | | | |
|---|---|---|---|
| 1274163 | 11/1986 | Russian Federation | 439/59 |

OTHER PUBLICATIONS

IBM Technical Disclosure Bulletin vol. 33, No. 1A pp. 435–437 Jun. 1990.

*Primary Examiner*—Donald Sparks
*Attorney, Agent, or Firm*—Robert J. Bennett, Esq.; Townsend & Townsend & Crew LLP

[57] ABSTRACT

A method and apparatus for blind alignment of electronic circuit boards. A receptacle with two vertical flanges and one horizontal flange is positioned relative to an electrical connection. A circuit board having a notch on a leading edge is proximally positioned to the receptacle. As the notched edge is moved toward the receptacle, the flanges guide the board into a registered position relative to the electrical connection. The method and apparatus may be used in any number of alignment situations including those as disparate as robotic assembly operations and assembly by untrained consumers and end-users.

6 Claims, 3 Drawing Sheets

BLIND ALIGNMENT METHOD AND APPARATUS FOR CIRCUIT BOARDS

BACKGROUND OF THE INVENTION

This invention relates to alignment and connection systems and mechanisms. More particularly, the present invention relates to a pre-alignment system and mechanism for electrical connectors that permits self-alignment and connection of a one printed wire board (PWB) to another.

There is a recognized need for modularization of PWB's. Commonly, modularization takes the form of isolating functions on separate PWB's. One PWB, referred to as the motherboard, frequently carries, and provides electrical interconnection for, other PWB's or daughter boards. The goal is for the daughter boards to be easily removable from the motherboard for inspection, upgrade, repair, or replacement.

As the functions performed by daughter boards become more complex, the number and type of electrical connections to the motherboard likewise become more complex. Electrical connectors on the market today are constructed so that their parts are easily mated so long as there is something that brings them into an initial registration or pre-alignment. Complex electrical connections may be jeopardized by tolerance build-up. Presently available pre-alignment systems tend to be expensive, inaccurate, and require assembly time. In fact, some pre-alignment systems may involve parts which increase the likelihood of erroneous assembly.

The invention provides advantages over prior art by utilizing pre-existing fabrication technologies to provide the basis of a pre-alignment guidance system. That is, the invention makes alignment detail integral to the daughter board PWB, thus obviating many of the assembly problems common to the prior art.

SUMMARY OF THE INVENTION

A general object of the present invention is to provide a simple and inexpensive, yet effective, apparatus for guiding circuit boards into registered, alignment with one another.

One specific object is to utilize pre-existing fabrication technologies to provide the basis of a system for blind mateable circuit board connection. The goal is to make alignment mechanism detail integral to the daughter board PWB, thus obviating many of the assembly problems common to the prior art.

The present invention is preferably used in systems using a modular structure in which a one PWB (e.g., a "daughter card") orthogonally interfaces with, and electrically connects to, another PWB (the "backplane" or "motherboard"). Typically, a card guide will receive parallel edges of the daughter card to guide it into an initial alignment with the motherboard. But, electrical connection between the connector parts mounted on both requires a closer alignment than is usually provided by card guides in order that the connector parts be correctly positioned for mating engagement. Thus, the alignment mechanism of the present invention operates to relatively locate the daughter card and motherboard in order to pre-align the connector parts, one carried by the daughter card, the other mounted on the motherboard, for mating engagement with one another to establish electrical connection.

In accordance with a preferred embodiment of the present invention, a pair of tooled receptacle pieces are mounted to a site such as a motherboard. Receiving edges of the two receptacles are each preferably beveled to guide a leading edge of an imprecisely positioned daughter card to a desired pre-alignment position for ultimate electrical and mechanical locked connection. The receiving edges of both receptacle pieces are formed with two parallel flanges. One of the receptacle pieces has a third flange, preferably in the shape of a wedge, medially located between the parallel flanges and spanning the distance between the parallel flanges. The receptacle pieces are registered to the site so that as a leading edge of the daughter card board slides into the receptacle, the daughter board is guided into proper engagement to the motherboard. The daughter card is notched on the leading edge to receive and be guided by the third flange of the one receptacle. Thus, the parallel flanges of the two receptacle pieces will receive and orient the daughter card angularly and in one (planar) direction, relative to the motherboard, while the engagement of the notch in the daughter card with the third flange locates the daughter card to the mother board in the transverse direction.

The receptacle pieces may be designed so they may be attached to and/or held on the motherboard, a card cage, a ichassis, a frame, a handle, a tool, or other fixture in a variety of ways. One preferred method employs two integral bosses that protrude from the base of the receptacle and fit into accurately located holes in the fixture. The bosses are then secured by means of snap-fit arms, an adhesive, bolts, screws, or any of numerous other retention devices known in the art. Another preferred method uses bosses not on the receptacle but on the holding fixture. In this embodiment, the bosses extend into spacing slots molded or machined into the receptacle.

An alternative method of mounting does not use either of the above techniques but provides the advantage of eliminating any holes in the fixture (in order not to disturb any signal traces formed on or carried by the fixtures). This method involves molding or tooling the receptacle pieces to yield a flat surface on the back, and mounting them with any suitable adhesive or tape (such as double-sided-foam tape). If this method of mounting is employed, the receptacle pieces are preferably accurately located on the motherboard, or other site, by the use of a window template; a fixture of certain thickness that contains an aperture, or a window which is just larger than the outline of the receptacle. The window template is first registered and temporarily attached to the motherboard. Then each receptacle piece is dropped through the appropriate aperture and affixed to the motherboard by the adhesive. The final step is to remove the window template. Of course, other ways are known in the art which may be employed in place of adhesive to affix the receptacle (e.g., tape, heating, welding, magnetic).

The leading edge notch on the daughter card involves a simple shape, preferably a "V" or a "U", of known dimensions. The shape may be molded or machined as part of the PWB manufacturing process. The primary advantage of this feature is that, unlike conventional guidance systems, it involves no additional parts or cost in manufacturing the board tab. In addition, the feature takes no additional assembly time, and does not encroach on valuable PWB real estate. Another major advantage of this feature is the elimination of excessive tolerance build-up. The position of the notch relative to a daughter card electrical and mechanical mating connector can be located as precisely as necessary. That is, forming the notch as part of the board tab and eliminating other alignment parts and assembly steps abates problems of tolerance in registering the alignment mechanism to the mating connector.

Together, the two receptacle pieces and notched daughter card provide a pre-alignment system that accurately locates circuit boards to one another to enable blind-mateable, self-alignment engagement of the connector means carried by the circuit boards. Among other advantages, the system is applicable for use by untrained customers and end-users and by robotic systems.

Accordingly, it is among the objects of the invention to provide slidable daughter PWB alignment devices for circuit assemblies with the devices being easily positioned and attached to motherboards, card cages, and other fixtures. These and other objects, advantages, features and characteristics of the invention will be apparent from the following description of the preferred embodiment, considered along with the accompanying drawings.

DESCRIPTION OF THE PREFERRED EMBODIMENT

The invention is a method and apparatus for blind alignment of electronic circuit boards. A pair of receptacle pieces, each with two vertical flanges, one with a horizontal flange, are positioned relative to an electrical connection. A circuit board having a notch on a leading edge is proximally positioned to the receptacle pieces. As the notched edge is moved toward the receptacle pieces, the flanges operate to receive the notched edge to guide it into a registered position relative to the electrical connection. The method and apparatus may be used in any number of alignment situations including those as disparate as robotic assembly operations and assembly by untrained consumers and end-users.

Figure 1:
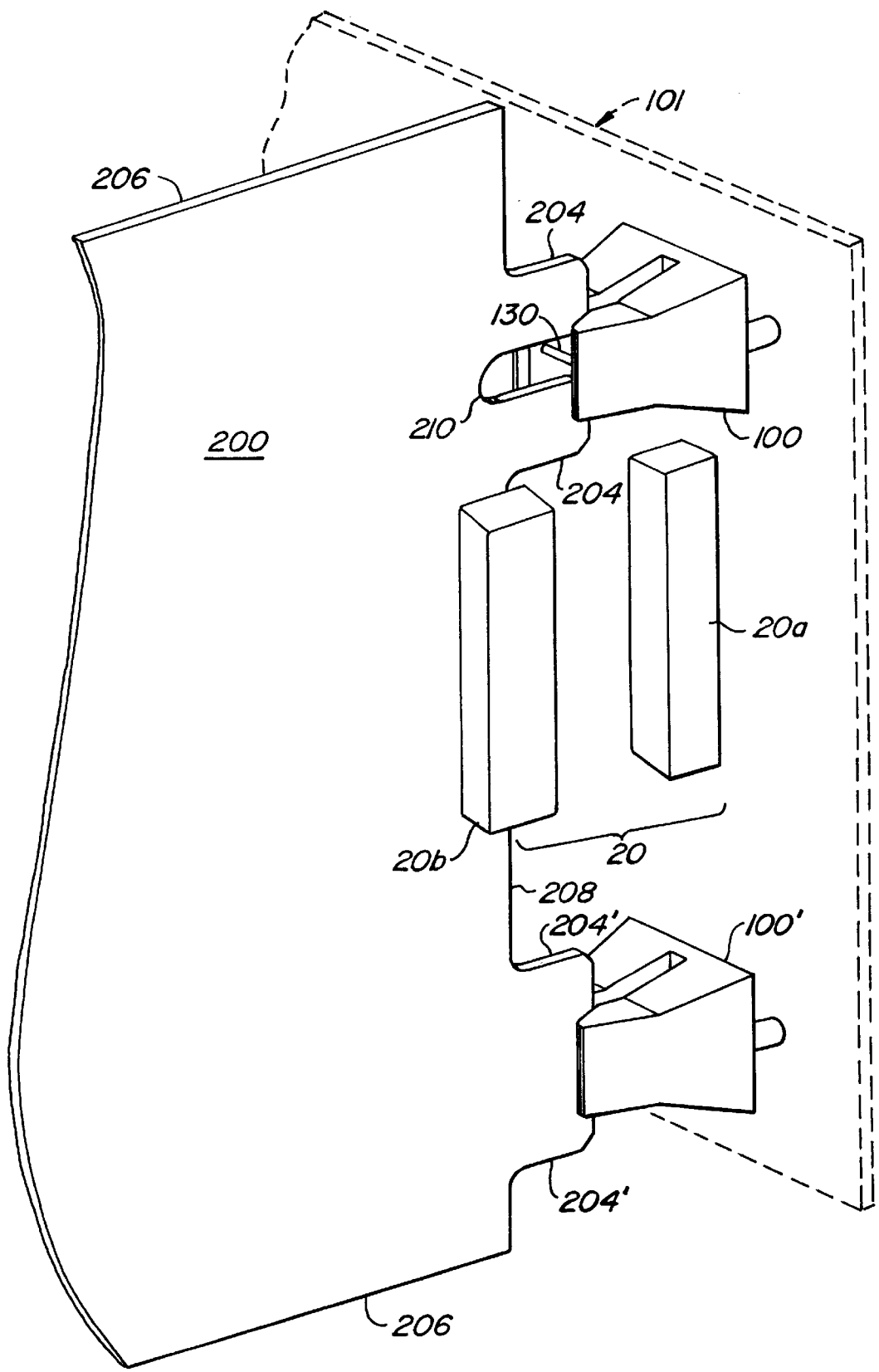
FIG. 1 is a perspective view of the daughter card posed to be inserted into two receptacle pieces constructed in accordance with the present invention.

Turning now to the drawings, and for the moment referring to FIG. 1, there is illustrated a PWB (daughter card) 200, positioned to be inserted into a receptacle 100 mounted to a motherboard 101 (shown in phantom). A notch 210, integral to PWB 200, is just wide enough to fit around a medial flange 130 (preferably wedge shaped) in the receptacle 100.

Although not specifically shown for reasons of clarity, the motherboard 101 forms a back surface of a cavity of a card cage that receives a number of PWBs, like PWB 200. The PWBs, including PWB 200, each would typically carry various electronic circuitry and/or devices of various types. The motherboard, also a PWB, functions to provide the electrical wiring that allows the PWBs, including PWB 200, that connect to the motherboard to communicate with one another. Electrical communication between the PWBs received by the motherboard is established by connectors such as the connector 20 formed by the connector part 20a (e.g., the plug or male pin assembly of the connector) carried by the PWB 200 and the mating connector part 20b (e.g., the receptacle or female assembly of the connector) carried by the motherboard 101. The system of the present invention operates to pre-align the connector parts 20a, 20b and position them within their mis-alignment range and allow their easy mating.

FIG. 1 shows a second receptacle 100'. The second receptacle 100' may or may not be needed, depending upon whether or not the PWB 200 needs to be rotationally stabilized in order that the connector parts 20a, 20b be correctly pre-aligned. As will be seen, the receptacle 100' is structured substantially identical to receptacle 100 except for the medial flange 130.

FIG. 1 also shows the PWB 200 having tabs 204, 204' formed on the edge 201 for receipt by the receptacles 100, 100'. Alternatively, the PWB 200 can be formed without such tabs; the edge need only be provided the notch 210 to employ the present invention—with or without the second receptacle 100'.

Typically, the card cage (not shown) containing the motherboard 101 will include conventional edge guides of one type or another, structured to receive the top and bottom edges 202 of the PWB. The edge guides provide a macro alignment to bring the edge of the PWB 200 (i.e., the tabs 102) into a position of initial receipt by the outer portions of the receptacles 100, 100'.

Figure 2A:
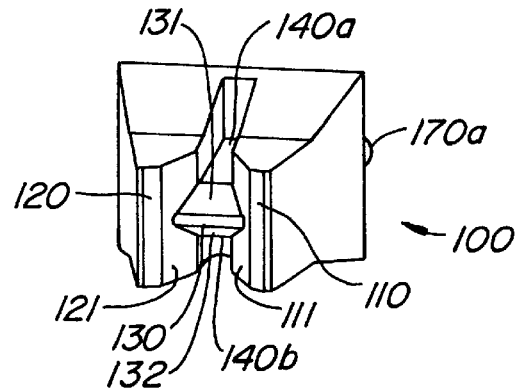
FIG. 2a is a front perspective view of the receptacle piece having the interior third flange, showing the preferred position of the two parallel flanges in relation to each other as well as the preferred shape of all three flanges.
Figure 2B:
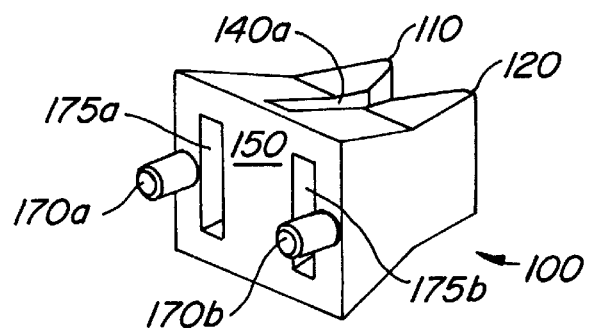
FIG. 2b is a rear perspective view of the receptacle piece of FIG. 2a, showing the mount side and mounting bosses.

Referring now to FIGS. 1, 2a, and 2b, the receptacle 100 is shown as being constructed with flanges 110 and 120 parallel to each other but orthogonal to, and flanking, the medial flange 130. In addition, flanges 110, 120, and 130 together form two slots 140a and 140b which are just sufficiently wide enough at their inner terminus to comfortably accommodate the width of the tab 202 PWB 200. Note, as can be particularly seen in FIG. 2a, how the confronting surfaces 111, 121 of the flanges 110, 120 taper in toward one another and the slots 140. In similar fashion, the medial flange 130 has tapered faces 131, 132. These tapers (111, 121, 131, 132) function to guide the notched and PWB tab 204 into the slots 140a, 140b.

FIG. 2b illustrates the rear, mount side surface 150 of receptacle 100. As FIG. 2 shows, the receptacle 100 is formed optional mounting bosses 170a and 170b, as well as optional spacing slots 175a and 175b. Voids such as spacing slots 175a and 175b are commonly included in molded parts to maintain wall thickness. That is, within a mold, protuberances which form spacing slots 175a and 175b help to insure that material injected into the mold flows evenly before setting and that unwanted voids and inclusions do not form. An additional benefit of the spacing slots 175a and 175b is that they may serve as insertion points for bosses or other attachment hardware protruding from a holding fixture. Thus, spacing slots 175a and 175b, a byproduct of the molding process, may be used as mounting points and eliminate the need to use or form mounting bosses 170a and 170b.

As indicated above, the receptacle 100' is substantially identical in structure to receptacle 100 with one exception: receptacle 100' lacks the medial flange 130. Accordingly, it will be understood that the discussion contained herein of the design and construction receptacle 100, with of course the exception of the medial flange 130, will apply equally to the receptacle 100' unless otherwise noted.

Figure 3A:
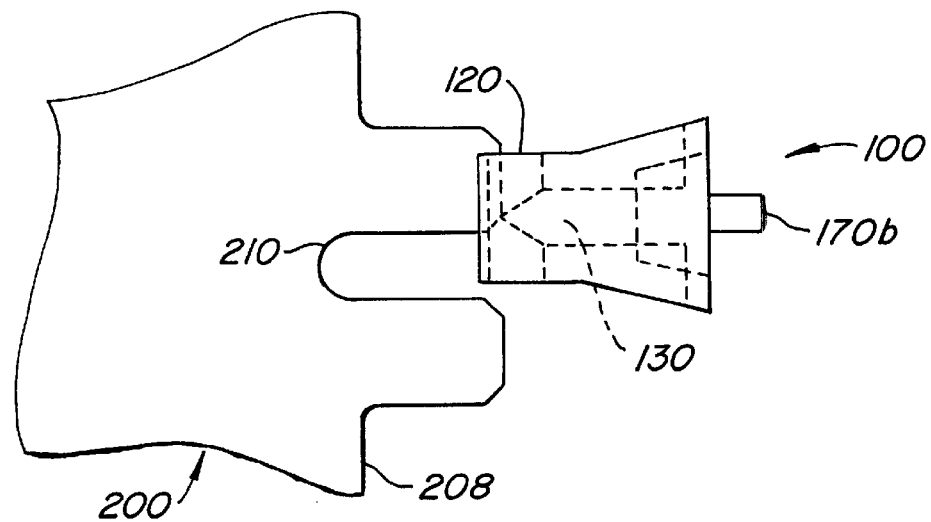
FIGS. 3a–3c are side views of the receptacle pieces showing progressive insertion of the daughter card.
Figure 3B:
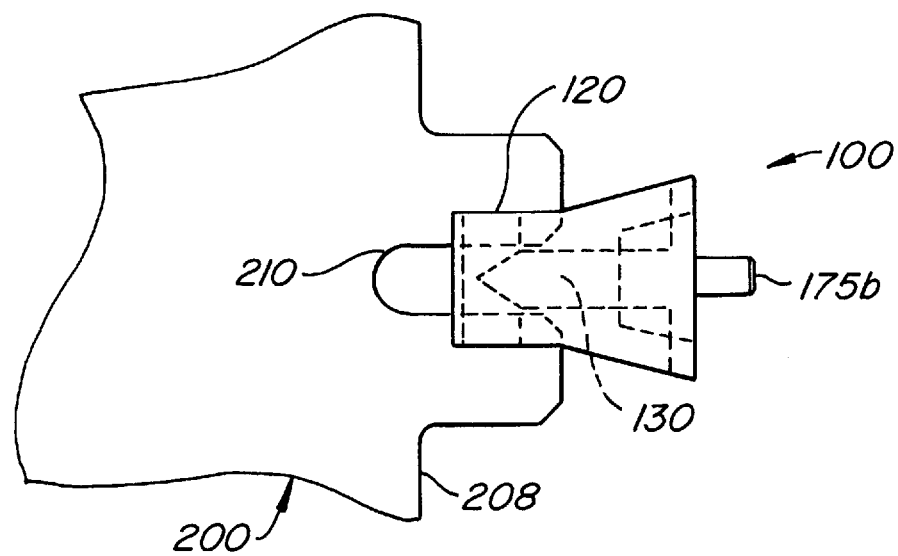
Figure 3C:
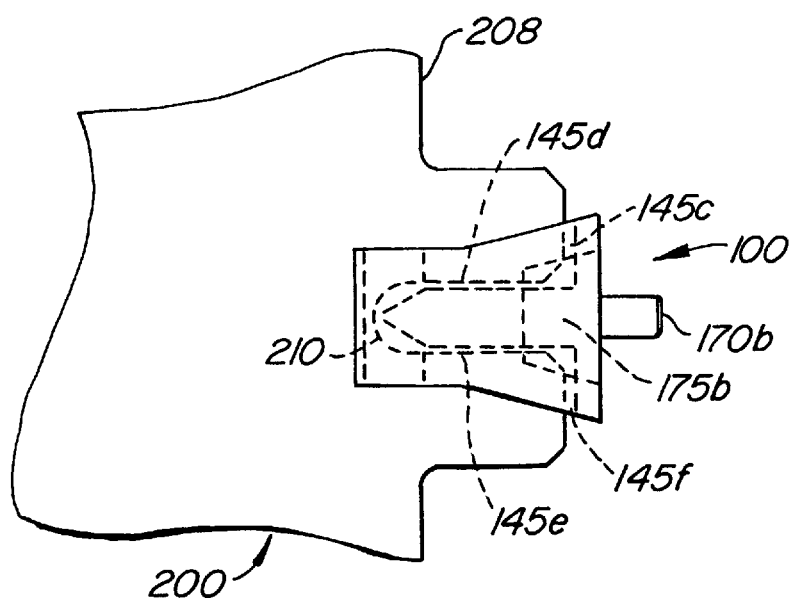

Turning now to FIGS. 3a–3c, the operation of the receptacle 100 (and receptacle 100'—if needed or used) can now be described. FIGS. 3a-3c illustrate, in progressive stages, the guiding operation performed by the receptacle 100 to bring the PWB 200 into registers, relation with the motherboard 101 to that the connector parts 20a and 20b can join. As indicated above, the motherboard 101 most likely will form the backwall of a card cage (not shown) constructed to receive a number of PWBs like PWB 200 to hold them in side-by-side, parallel orientation. The card cage will include edge guides (not shown) that receive the edges 206 of the PWB, operating to provide a macro alignment of the PWB, to guide its front edges 208 and, in particular, the notched tab 204, into range of the receptacle 100. Thus, FIG. 3a illustrates the edge guides (or whatever else may be used—not shown) of the card cage as bringing the notched tab 204 of the PWB 200 into proximate location with the receptacle 100. The flanges 110 (not shown in FIG. 6a) and 120 will engage PWB 200, operating to locate the front edge 208 of the PWB in the transverse direction. As the insertion of the PWB 200 continues, the medial flange 130 will engage the notch 210 (FIG. 3b). The medial flange 130 will orient the PWB 200, and thereby the front edge 200, vertically (as viewed in FIG. 1). The tapered faces 111, 121 of the parallel flanges 110, 120 (FIG. 2a) and the tapered faces 131, 132 of the medial flange 130 will smoothly orient the edge 208 of the PWB 200 to locate the connector port 20a (FIG. 1) within the mis-alignment range of the connector 20 so that continued insertion will allow the connector ports 20a, 20b to mechanically and electrically engage, establishing electrical connection with the motherboard 101.

If necessary, receptacle 100' is also used to receive and primarily guide the edge 208 of the PWB 200 rotationally relative to the motherboard 101. It may be, however, that the PWB 200 is small enough so that only the single receptacle 100 is needed. Or, the edge guides may provide sufficient macro-alignment to use only the single receptacle 100. Even if the second receptacle 100 is used, not that there is no need to have more than the single notch 210 for the vertical (as viewed in FIG. 1) pre-alignment of the PWB 200.

The notch 210 formed in the PWB 200 is accurately registered to the connector part 20a carried by the PWB 200. Similarly, the receptacle 100 is also accurately registered to the connector part 20b carried by the motherboard 101. In this way, the capture of PWB 200 and notch 210 by the receptacle 100 pre-align the connector parts 20a, 20b to within the mis-alignment range of the connector 20, allowing them to easily establish mechanical and electrical engagement.

Advantages of the receptacle include, but are not limited to, the ability to manufacture it quickly and cheaply out of materials such as molded plastic. It can also be machined from a suitable material such as metal or manufactured out of a composite or hybrid material. An advantage of manufacturing the receptacle wholly or partly from metal, or other electrically conductive material, is that power may be supplied to PWB 200 through the receptacle or a ground connection may be made.

To those skilled in the art to which the present invention pertains, many changes in construction and widely varying embodiments will be suggested without departure from the spirit and scope of the present invention. The description and the disclosures herein are presented by way of illustration of this invention and are not limiting of the scope thereof.

What is claimed is:

1. A system for guiding an edge of a first circuit board into an aligned position with a second circuit board, the system comprising:
    a pair of spaced-apart tabs extending from the edge of the first circuit board, a one of the tabs having a notch formed therein;
        first and second receptacle units mounted on the second circuit board and positioned to respectively receive the one and the other of the pair of tabs, each of the first and second receptacle units having a channel formed by a pair of flanges having inner, confronting, surfaces spaced sufficiently apart to accept corresponding ones of the pair of tabs; and
        the first receptacle unit including a medially located wedge-shaped flange extending between the inner, confronting surfaces, the medially located flange being sized and dimensioned for receipt by the notch.

2. The apparatus as in claim 1 further comprising means for attaching each of the pair of receptacle units to a motherboard.

3. The apparatus of claim 2 wherein the attaching means comprises one or more bosses attached to each of the pair of receptacle units and means for attaching the one or more bosses to the motherboard for holding the pair of receptacle units.

4. The apparatus of claim 2 wherein the means for attaching comprises one or more spacing slots integral to each of the pair of receptacle units and means for attaching the one or more spacing slots to the means for holding the pair of receptacle units.

5. The system of claim 1, wherein the pair of flanges of each of the first and second receptacle units include facing angular surfaces that form a wedge-shaped opening that initially receives and guides the corresponding ones of the pair of tabs into the channel.

6. A method for guiding a an edge of a first circuit board into an aligned position with a second circuit board, the system comprising:
    forming a pair of spaced-apart tabs to extend from the edge of the first circuit board, a one of the tabs having a notch formed therein;
        mounting first and second receptacle units on the second circuit board positioned to respectively receive the one and the other of the pair of tabs, each of the first and second receptacle units having a channel formed by a pair of flanges having inner, confronting, surfaces spaced sufficiently apart to accept corresponding ones of the pair of tabs; and
        forming the first receptacle unit to include a medially located wedge-shaped flange that extends between the inner, confronting surfaces, the medially located flange being sized and dimensioned for receipt by the notch, including a narrow portion that is initially received by the notch.

* * * * *